United States Patent
Arola et al.

(10) Patent No.: US 10,191,600 B2
(45) Date of Patent: Jan. 29, 2019

(54) DEVICE WITH MECHANICAL KEYS AND CAPACITANCE MEASUREMENT

(71) Applicant: Microsoft Technology Licensing, LLC, Redmond, WA (US)

(72) Inventors: Joni Arola, Tampere (FI); Jari Saukko, Tampere (FI); Pertti Husu, Tampere (FI)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 14/919,035

(22) Filed: Oct. 21, 2015

(65) Prior Publication Data

US 2017/0115767 A1 Apr. 27, 2017

(51) Int. Cl.
| | | |
|---|---|---|
| G06F 3/041 | (2006.01) | |
| G06F 3/044 | (2006.01) | |
| G06F 3/02 | (2006.01) | |
| G06F 1/16 | (2006.01) | |
| G06F 3/01 | (2006.01) | |
| H03K 17/955 | (2006.01) | |
| H03K 17/96 | (2006.01) | |
| H03K 17/975 | (2006.01) | |

(52) U.S. Cl.
CPC ............ *G06F 3/044* (2013.01); *G06F 1/1643* (2013.01); *G06F 1/1692* (2013.01); *G06F 3/016* (2013.01); *G06F 3/0227* (2013.01); *G06F 3/0416* (2013.01); *H03K 17/955* (2013.01); *H03K 17/962* (2013.01); *H03K 17/975* (2013.01); *G06F 2203/04101* (2013.01); *G06F 2203/04103* (2013.01)

(58) Field of Classification Search
CPC ................. G06F 3/044; G06F 3/0227; G06F 1/169–1/1692; H03K 17/955; H03K 17/962–17/9622; H03K 17/975
See application file for complete search history.

(56) References Cited

U.S. PATENT DOCUMENTS

| | | |
|---|---|---|
| 3,728,509 A | 4/1973 | Shimojo |
| 5,311,656 A | 5/1994 | Eldershaw |
| 6,369,330 B2 | 4/2002 | Chou |
| 6,912,280 B2 | 6/2005 | Henry |
| 7,498,537 B1 | 3/2009 | Duwel |
| 7,884,299 B2 | 2/2011 | Glew |

(Continued)

OTHER PUBLICATIONS

"How Does this Button Work Without any Circuit Closing Device?", Retrieved on: Jul. 10, 2015, Available at: http://electronics.stackexchange.com/questions/177196/how-does-this-button-work-without-any-circuit-closing-device.

(Continued)

*Primary Examiner* — Amare Mengistu
*Assistant Examiner* — Crystal A Mathews

(57) ABSTRACT

A portable device is provided. The device comprises a controller, a touch sensing element, a capacitance measurement element integrated in the touch sensing element and coupled to the controller, and at least one mechanical pressing region coupled to the capacitance measurement element. The capacitance measurement element is configured to measure change in capacitance of at least one mechanical pressing region caused by proximity or physical interaction between the at least one mechanical pressing region and an external object. A system and method are also presented.

20 Claims, 3 Drawing Sheets

(56) References Cited

U.S. PATENT DOCUMENTS

| | | |
|---|---|---|
| 8,450,627 B2 | 5/2013 | Mitileman et al. |
| 8,872,771 B2 | 10/2014 | Hotelling et al. |
| 9,300,033 B2* | 3/2016 | Han .................... H01Q 1/243 |
| 2002/0042291 A1* | 4/2002 | Lahteenmaki ...... H04M 1/0202 |
| | | 455/566 |
| 2004/0013262 A1* | 1/2004 | Henry ................. H01H 13/702 |
| | | 379/368 |
| 2006/0278444 A1 | 12/2006 | Binstead |
| 2008/0267537 A1* | 10/2008 | Thuries ............. G06K 7/10851 |
| | | 382/321 |
| 2010/0328230 A1* | 12/2010 | Faubert ................ G06F 1/1626 |
| | | 345/173 |
| 2011/0079498 A1* | 4/2011 | Lin ..................... G06F 3/03547 |
| | | 200/341 |
| 2011/0080155 A1* | 4/2011 | Aldridge ................. H02N 2/18 |
| | | 323/318 |
| 2011/0080350 A1* | 4/2011 | Almalki ............... G06F 3/0414 |
| | | 345/173 |
| 2012/0139873 A1 | 6/2012 | Li et al. |
| 2012/0199459 A1 | 8/2012 | Reise |
| 2012/0217982 A1* | 8/2012 | Narayanasamy .... H03K 17/962 |
| | | 324/686 |
| 2012/0223910 A1* | 9/2012 | McCracken .......... G06F 1/1626 |
| | | 345/174 |
| 2013/0093500 A1 | 4/2013 | Bruwer |
| 2013/0278562 A1* | 10/2013 | Graumann ............... G06F 3/044 |
| | | 345/174 |
| 2014/0002362 A1 | 1/2014 | Srivastava |
| 2014/0104216 A1* | 4/2014 | Adachi .................... G06F 3/041 |
| | | 345/173 |
| 2014/0191420 A1 | 7/2014 | Chuah |
| 2014/0218330 A1 | 8/2014 | Ady et al. |
| 2014/0251776 A1* | 9/2014 | Kim ....................... H01H 13/66 |
| | | 200/5 R |
| 2014/0267043 A1* | 9/2014 | Kaiser ..................... G06F 3/021 |
| | | 345/168 |
| 2014/0340317 A1 | 11/2014 | Rodzeveski et al. |
| 2014/0354305 A1 | 12/2014 | Hanssen et al. |
| 2015/0029645 A1* | 1/2015 | Kim ......................... G05G 1/02 |
| | | 361/679.01 |
| 2015/0171916 A1* | 6/2015 | Asrani ..................... H04B 1/68 |
| | | 455/575.7 |
| 2016/0216801 A1* | 7/2016 | Shedletsky ............. G06F 3/044 |
| 2017/0090599 A1* | 3/2017 | Kuboyama ............. G06F 3/038 |

OTHER PUBLICATIONS

"International Search Report and Written Opinion Issued in PCT Application No. PCT/US2016/052407", dated Jan. 2, 2017, 16 Pages.

"Second Written Opinion Issued in PCT Application No. PCT/US2016/052407", dated Aug. 30, 2017, 7 Pages.

"International Preliminary Report on Patentability Issued in PCT Application No. PCT/US2016/052407", dated Jan. 29, 2018, 8 Pages.

* cited by examiner

DEVICE WITH MECHANICAL KEYS AND CAPACITANCE MEASUREMENT

BACKGROUND

Mechanical keys in modern portable devices can serve various purposes, such as a keyboard, for volume control, screen lock and others. Usually in devices with touch screens the mechanical keys serve a secondary purpose and are positioned on the edges of the device. The side keys are usually coupled to the printed circuit board (PCB) in order to perform their functions. The mechanical keys provide a tactile feedback different from a touch surface, so in some cases they can be preferable—cases like when a user cannot see the display of the device but wishes to give quick commands, for example change volume while the mobile phone is in the pocket.

SUMMARY

The following presents a simplified summary of the disclosure in order to provide a basic understanding to the reader. This summary is not an extensive overview of the disclosure and it does not identify key/critical elements or delineate the scope of the specification. Its sole purpose is to present a selection of concepts disclosed herein in a simplified form as a prelude to the more detailed description that is presented later.

A device with touch sensing and capacitance measurement capabilities is presented. Capacitance measurement can be integrated in the touch sensor. The device comprises a mechanical pressing region, and a "press" of the mechanical pressing region is monitored by the capacitance measurement element to which it is connected. Options with various kinds of pressing regions are presented including a mechanical key and part of the device casing. A system and method for assembling the device are also presented.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present embodiments and is not intended to represent the only forms in which the present invention may be constructed or utilized. However, the same or equivalent functions and sequences may be accomplished by different embodiments.

The embodiments described below are not limited to implementations which solve any or all of the disadvantages of known devices with mechanical keys. Although the present examples are described and illustrated herein as being implemented in flat portable electronic devices, the devices described are provided as an example and not a limitation. As those skilled in the art will appreciate, the presented embodiments are suitable for application in a variety of portable devices with capacitance touch sensing functionality.

In the embodiments described below, a concept of capacitive measurement combined with mechanical feedback is used. To a user, the device on the outside may appear as a portable device with mechanical keys or pressing areas which can have reconfigurable functions. However, a direct connection of mechanical pressing regions with the circuitry of the device such as the PCB is not necessary because the detection of a "press" of the key is performed at least in part by a capacitance measurement element integrated in the touch sensor, as described below.

Figure 1A:
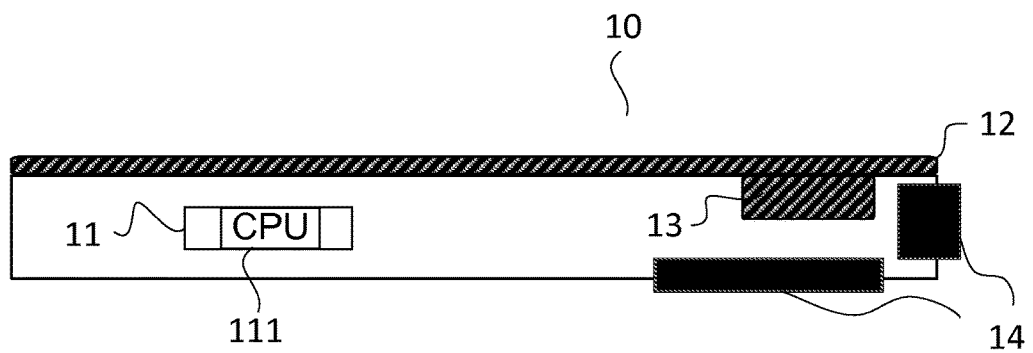
FIG. 1a is a schematic side view of a device according to an embodiment.
Figure 1B:
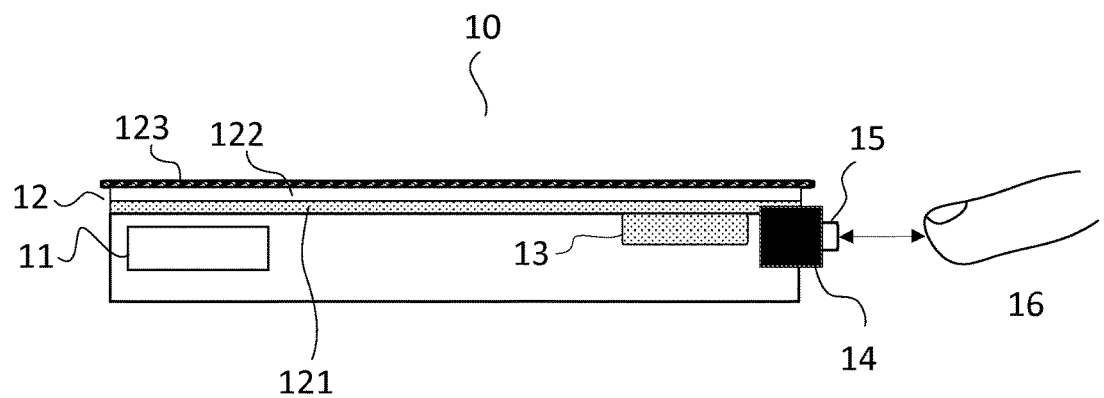
FIG. 1b is a schematic side view of a device according to an alternative embodiment.

FIG. 1 is a schematic illustration of a portable device 10 according to an embodiment. The device 10 comprises a controller 11, a touch sensing element 12, a capacitance measurement element 13 integrated in the touch sensing element 12, and at least one mechanical pressing region 14. The capacitance measurement element 13 is schematically shown as a separate box in FIGS. 1a and 1b, this is for illustration purposes. In the presented embodiments, the capacitance measurement element is fully integrated in the touch sensing element 12, for example as part of a capacitive touch screen. The thickness of the capacitive measurement element integrated into the touch sensing element 12 may be between 1 micrometer and 1 millimeter. In embodiments, the touch sensing element 12 can be implemented in a cover, integrated into a display or a standalone touch sensor. These implementations are all schematically illustrated under touch sensing element 12. In an alternative embodiment, the capacitance measurement element 13 is a standalone element and may have a characteristic size, for example thickness, between 0.1 and 2 millimeters.

The controller 11 may comprise a processor 111, and it is coupled to the capacitance measurement element 13, whereas the pressing region 14 is coupled to the measurement element 13. The connections are not illustrated by lines in the figures and are explained in the text instead.

The capacitance measurement element 13 is configured to measure the change in capacitance of the mechanical pressing region 14 caused by proximity or physical interaction between the mechanical pressing region and an external object 16. A primary function of the capacitance measurement element 13 can be capacitive touch sensing of the element 12 in which it is integrated, and the measurement of change in capacitance of the mechanical pressing region 14 may be a secondary function. When a conductive external object 16 such as a finger or stylus is brought into proximity or physical contact with the mechanical pressing region 14, the capacitance of the region 14 changes. This change can also be caused by the movement of parts of the mechanical pressing region, for example if the space below a mechanical key is changed. The capacitance measurement can be carried for example using conventional capacitive touch screen technology.

This allows detection of the pressing region 14 being "pressed" by the external object 16. The "press" may be physical touch by the object 16, such as a finger or a conductive stylus, or it may be a hovering motion or proximity of the object 16, sufficient to alter the capacitance of the region 14. In an embodiment, this measurement can then be provided to the controller 11. The controller 11 can be configured to trigger a function upon receiving a measurement of the change in capacitance. The function may be predefined, assigned by a user or by application software running on the device. The function may also depend on the mode of the device 10, for example working mode, standby mode etc. Complex functions may be triggered based on a gradual change in capacitance in proximity of the mechanical pressing region 14. The controller 11 may also be configured to prevent triggering of any functions if a grip or accidental touch is detected near multiple pressing regions 14, to avoid erroneously triggering individual functions of particular regions.

Figure 2:
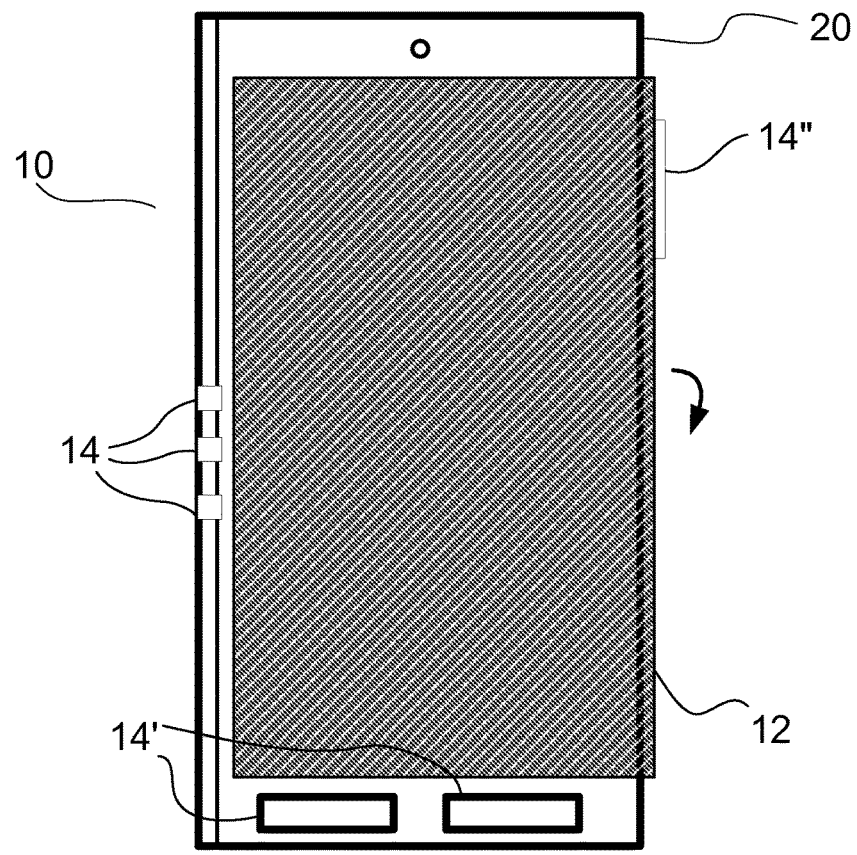
FIG. 2 is a top view of a device according to an embodiment.

In an embodiment, the device 10 may have a horizontally prolonged shape, as shown in FIGS. 1*a*-1*b* and 2. The device 10 can be prolonged in the horizontal dimensions, and substantially thin in the vertical dimension. In this embodiment, a mechanical pressing region 14 is positioned at an edge of the device 10, as shown in the Figures. However, other shapes are possible according to alternative embodiments. FIG. 1*a* also shows that the device 10 may comprise more than one mechanical pressing region 14, and in this embodiment one of them is positioned on the back side of the device 10, also coupled to the capacitance measurement 13.

In an embodiment, the touch sensing element 12 comprises a capacitive touch screen, wherein the capacitance measurement element 13 is integrated in the capacitive touch screen 12, and the mechanical pressing region 14 is coupled to the capacitive touch screen 12. The integrated capacitance measurement element 13 can be configured to measure changes in capacitance of the specific area of the pressing region 14, and work independently of the capacitance measurement circuit of the capacitive touch screen. Alternatively, the capacitance measurement functionality may be unified in the touch screen 12.

FIG. 1*b* is a similar illustration of a device according to the embodiment. The touch screen is schematically shown comprising a stack of three layers, for example a touch sensing layer 121, an active display layer 122 and a protective layer 123. As it is clear to a skilled person, the touch screen is not limited to this layout.

The mechanical pressing region 14 can comprise a mechanical key 15 coupled to the capacitance measurement element 13, and the capacitance measurement element 13 is configured to measure change in capacitance of the mechanical pressing region 14 when the mechanical key 15 is pressed. In an embodiment, the device 10 can further comprise a press detection element (not shown) coupled to the controller 11, wherein the press detection element is configured to detect that the mechanical key 15 is fully pressed. The controller 11 in the embodiment is configured to trigger an additional function upon detection that the mechanical key 15 is fully pressed. The mechanical 15 key can be of any shape or length, and provide tactile feedback to a user if it is pressed with a finger. The region 14 with a mechanical key 15 are not limited to the configuration wherein they can be pressed by a finger, and can be operated with various external objects 16. Each pressing region 14 can comprise more than one mechanical key 15.

As it is clear to a skilled person, adding a mechanical key 15 to the mechanical pressing region 14 is not necessary. The region 14 may comprise areas to be pressed on the side of the device 10 which can be marked visually, for example in the user interface of the device 10, and provide tactile feedback without an actual mechanical key 15.

The device 10 may comprise a press detection element coupled to the controller 11. This element is configured to detect that the mechanical key 15 is fully pressed and provide this information to the controller 11, which in turn is configured to trigger an additional function upon receiving this detection. The press detection element can comprise a visual or audio sensor, confirming a fully pressed state of the mechanical key 15. The additional function assigned to the fully pressed button can be complimentary to the main function triggered by the controller 11 when capacitance change is measured by the element 13. For example, the function triggered by the controller when capacitance change is measured by proximity of an external object 16 or partial press of the key 15 can be selection of a predetermined multimedia command, and a full press of the key 15 can trigger the command itself. The controller may also be configured to trigger user feedback once the key 15 is fully pressed.

In an embodiment, the full press of a mechanical key 15 is determined by change of capacitance of the pressing region 14 without the additional press detection element.

The capacitance measurement element 13 can comprise a capacitive field measurement element. In this embodiment, the element 13 measures change in capacitive field surrounding the pressing region 14, which can provide detection of proximity and distance of an external object near the pressing region 14.

In an embodiment, the device 10 comprises a tactile feedback element configured to provide tactile feedback to a user when he or she physically contacts at least one mechanical pressing region 14. While tactile feedback can be provided by a mechanical key 15, the device in this embodiment comprises a separate element for the tactile feedback. The element can comprise an electrical signal generator, or an external stripe with a shape that provides tactile feedback to differentiate from the rest of the device. This can be useful for example in embodiments with no mechanical key 15 in the pressing region 14.

FIG. 2 is a schematic top view of a portable device 10 according to an embodiment. In this embodiment, the device 10 is presented as a mobile phone with a plurality of mechanical pressing regions 14, 14' and 14". The device 10 also comprises a capacitive touch screen 12 which, according to the embodiment illustrated, extends over the right edge of the device 10, as illustrated by the curved arrow. This is only an example of a configuration and can be useful if touch sensing capabilities are to be extended over edges of the device 10. The capacitive measurement capabilities are also carried out by the capacitive touch screen 12. In other embodiments, the device 10 may comprise a separate capacitive measurement element 13 not shown in FIG. 2.

This figure shows some of the various options for positioning the pressing regions 14, 14' and 14". For example, element 14 is shown as three pressing regions which can have related functions assigned to them. Element 14' comprises two mechanical buttons, and can resemble the basic function-related buttons of cell phones, but the mechanical buttons 14' are coupled to the capacitive measurement element 13 and their "press" is measured by change of capacitance. The region 14" can be, for example, a volume control key which is configured to respond differently to a press on the top vs. a press on the bottom. This can be achieved by integrating two keys under the single volume control key 14", or by detecting the position of an external object from the change in capacitance in proximity of the region 14" by the touch screen 12. A software algorithm may be used for the touch screen 12 to detect an exact position of the external object near the region 14".

All functions assigned to the mechanical pressing regions 14 of the device 10 can be reconfigurable and/or dependent on the application that is running on the device.

In an embodiment, the device 10 comprises a casing 20. The casing 20 encloses the bottom and edges of the device 10, and meets the capacitive touch screen 12 at the edges so that the internal part of the device 10 is at least partially sealed. In an embodiment, the casing 20 comprises a frame which supports the touch sensing element 12 at least at two edges. The mechanical pressing region is embedded in the frame according to the embodiment, such as the three regions 14 shown on FIG. 2. The frame may go around the edges of the device, or have any other shape which supports the touch screen at least on two sides.

According to an embodiment, the casing 20 comprises non-conductive material. The material may be plastic and/or rubber. This can affect the capacitance measurement when a conductive external object 16 makes contact with the non-conductive mechanical pressing region 14, which is embedded in the casing. This effect allows using cheaper capacitive measurement elements 13 and touch sensors 12.

The above embodiments provide a technical effect of free placement of mechanical pressing regions 14 and keys 15 across the body of the device. The placement does not depend on direct connection of these elements to the PCB and therefore it allows more flexibility in the design of portable devices 10. In thin devices the placement of PCB can be quite restrictive, so the additional placement options provided by the above embodiments can be useful in portable electronic devices.

Devices according to any of the above embodiments can be used in portable electronic devices such as mobile phones, tablets, foldable laptop computers, e-readers and other devices. The devices may be embedded in or attached to an electronic system.

Figure 3:
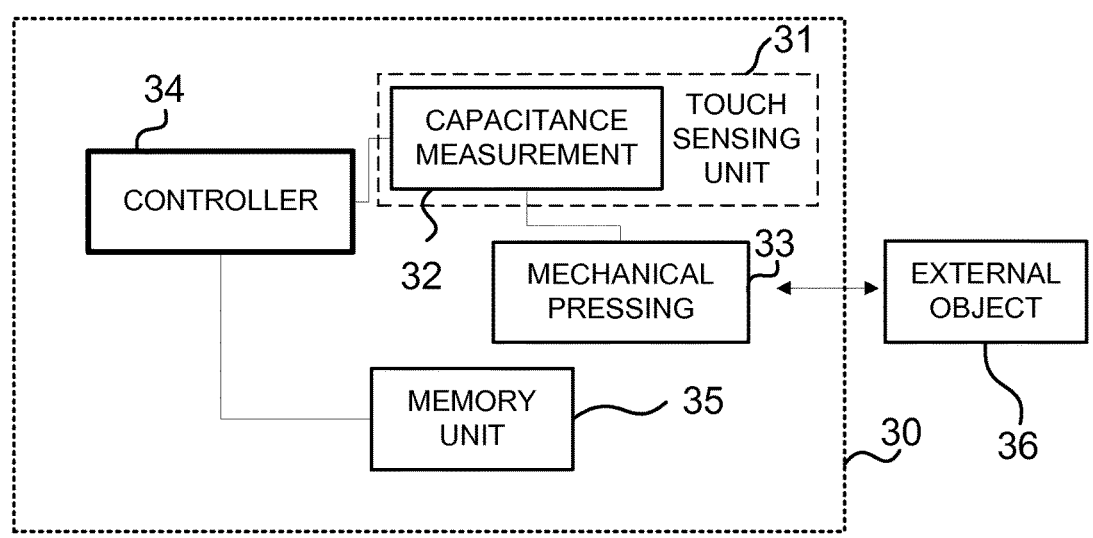
FIG. 3 is schematic diagram of a system according to an embodiment.

FIG. 3 is a schematic diagram of a system 30 according to an aspect. The system 30 may be a system for capacitive measurement of mechanical pressing regions, or a portable electronic system.

The system 30 comprises a touch sensing unit 31 which comprises capacitance measurement element 32. In an embodiment, the touch sensing unit 31 is a capacitive touch screen. The system 30 also comprises at least one mechanical pressing region 33 coupled to the capacitance measurement unit 31, a memory unit 35 that stores information comprising at least one function assigned to the mechanical pressing regions 33, and a controller 34 coupled to the capacitance measurement element 32 and the memory 35. The capacitance measurement element 32 is configured to measure change in capacitance of one or more mechanical pressing regions 33 caused by proximity or physical interaction between the pressing regions 33 and an external object 36. Naturally, the system 30 may comprise any number of mechanical pressing regions 33 and more than one capacitance measurement element 32. The controller 34 coupled to the element 32 is configured to receive this measurement and trigger at least one function stored in the memory 35 and assigned to the at least one pressing region 33.

The capacitance measurement element 32 can be a capacitive field measurement element configured to measure change in the capacitive field surrounding the mechanical pressing region 33. In an embodiment, the capacitance measurement element 32 is configured to measure change in capacitance of the pressing region 33, for example an area around a mechanical key, wherein the change is caused by proximity of an external object 36 selected from a conductive stylus and a finger. The conductive stylus may be part of the system 30 according to an embodiment.

In an embodiment, the system 30 comprises a movement detection unit coupled to the controller, not shown on FIG. 2. This unit is configured to detect movement of an external object 36 in proximity of the mechanical pressing region 33. This detection can be provided to the controller 34 as additional information related to proximity of an external object 36, and the controller 34 can also be configured to trigger additional functions stored in the memory unit 35 when the detection is made.

The system according to the above embodiments may be used in portable electronics, for example handheld devices that comprise a touch screen. An effect of using this system is freedom of placement of units, and independence of the PCB position.

Figure 4:
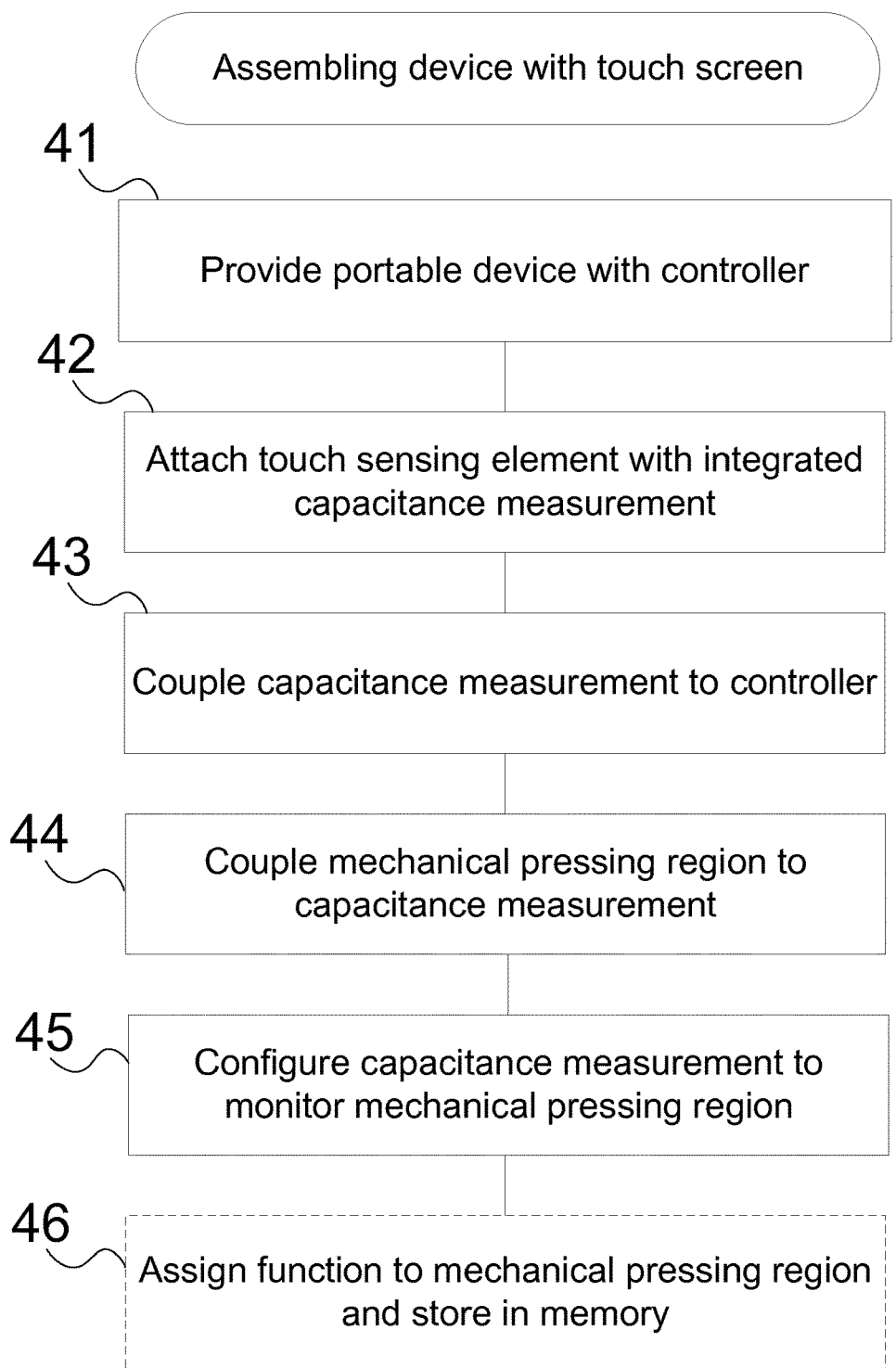
FIG. 4 is a flow chart of a method according to an embodiment.

FIG. 4 is a flow chart for a method according to an aspect. The method can be a method for assembling or manufacturing a device comprising a touch screen. The method comprises providing 41 a portable device comprising a controller; attaching 42 a touch sensing element with an integrated capacitance measurement element to the portable device. The method further comprises coupling 43 the integrated capacitance measurement element to the controller and coupling 44 at least one mechanical pressing region to the capacitance measurement element. The coupling 43, 44 can be done by wiring, coupling through a circuit board or wireless coupling. The method also comprises configuring 45 the capacitance measurement element to measure change in capacitance of the mechanical pressing region caused by proximity or physical interaction between the mechanical pressing region and an external object.

In an embodiment, coupling 44 of a mechanical pressing region can comprise coupling a mechanical key to the capacitance measurement unit. Configuring 45 the capacitance measurement element to measure change in capacitance comprises configuring the element to detect that the mechanical key is pressed.

According to an embodiment, the method also comprises assigning 46 at least one function to at least one mechanical pressing region, storing the assigned at least one function in a memory, and coupling the memory to the controller.

The methods described above can have an effect on simple assembly of a thin portable device with mechanical keys wherein electronic contact of mechanical pressing regions with the circuitry is not necessary.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other examples described to form further examples without losing the effect sought.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in a tangible storage media, but propagated signals per se are not examples of tangible storage media. The software can be suitable for execution on a parallel processor or a serial processor such that the method steps may be carried out in any suitable order, or simultaneously.

According to an aspect, a portable device is disclosed. The device comprises a controller, a touch sensing element, a capacitance measurement element integrated in the touch sensing element and coupled to the controller, and at least one mechanical pressing region coupled to the capacitance measurement element. The capacitance measurement element is configured to measure change in capacitance of at least one mechanical pressing region caused by proximity or physical interaction between the at least one mechanical pressing region and an external object.

In an embodiment, the touch sensing element comprises a capacitive touch screen, the capacitance measurement element is integrated in the capacitive touch screen, and the at least one mechanical pressing region is coupled to the capacitive touch screen.

In an embodiment, alternatively or in addition to the above embodiments, the device has a prolonged shape in the horizontal plane, and at least one mechanical pressing region is positioned at an edge of the device.

In an embodiment, in addition to the above embodiment, the touch sensing element extends over the edges of the device.

In an embodiment, alternatively or in addition to the above embodiments, the casing encloses the bottom and edges of the device, and at least one mechanical pressing region is embedded in the casing.

In an embodiment, in addition to the above embodiment, the casing comprises a frame, the frame supports the touch sensing element at least at two edges, and the at least one mechanical pressing region is embedded in the frame.

In an embodiment, in addition to the previous two embodiments, the casing comprises non-conducting material.

In an embodiment, alternatively or in addition to the above embodiments, at least one mechanical pressing region comprises a mechanical key coupled to the capacitance measurement element, and the capacitance measurement element is configured to measure change in capacitance of the at least one mechanical pressing region when the mechanical key is pressed.

In an embodiment, in addition to the above embodiment, the controller is configured to trigger a function upon measurement of the change in capacitance of the at least one mechanical pressing region when the mechanical key is pressed.

In an embodiment, in addition to the above embodiment, the device comprises a press detection element coupled to the controller, wherein the press detection element is configured to detect that the mechanical key is fully pressed, and the controller is configured to trigger an additional function upon detection that the mechanical key is fully pressed.

In an embodiment, alternatively or in addition to the above embodiments, the capacitance measurement element comprises a capacitive field measurement element, and the capacitive field measurement element is configured to measure change in capacitive field surrounding at least one mechanical pressing region caused by proximity or physical interaction between the at least one mechanical pressing region and an external object.

In an embodiment, alternatively or in addition to the above embodiments, the device comprises a tactile feedback element configured to provide tactile feedback to a user of the device when at least one mechanical pressing region is pressed.

In an embodiment, alternatively or in addition to the above embodiments, the device is implemented as a handheld electronic device.

According to an aspect, a system is presented. The system comprises a touch sensing unit comprising a capacitance measurement element, at least one mechanical pressing region coupled to the capacitance measurement element, a controller coupled to the capacitance measurement element, and a memory unit coupled to the controller. The memory unit comprises at least one function assigned to at least one mechanical pressing region. In the system, the capacitance measurement element is configured to measure change in capacitance of the at least one mechanical pressing region caused by proximity or physical interaction between the at least one mechanical pressing region and an external object, the controller is configured to trigger at least one function assigned to the at least one mechanical pressing region.

In an embodiment, the capacitance measurement element is configured to measure change in capacitance of at least one mechanical pressing region caused by proximity or physical interaction between the at least one mechanical pressing region and a conductive stylus or a finger.

In an embodiment, alternatively or in addition to the above embodiments, the system comprises a movement detection unit coupled to the controller, wherein the movement detection unit is configured to detect movement of an external object in proximity of at least one mechanical pressing region.

In an embodiment, alternatively or in addition to the above embodiments, the system comprises a cover configured to cover at least part of the touch sensing unit.

According to an aspect, a method is provided. The method comprises: providing a portable device comprising a controller; attaching a touch sensing element with an integrated capacitance measurement element to the portable device; coupling the integrated capacitance measurement element to the controller; coupling at least one mechanical pressing region to the capacitance measurement element, and configuring the capacitance measurement element to measure change in capacitance of at least one mechanical pressing region caused by proximity or physical interaction between the at least one mechanical pressing region and an external object.

In an embodiment, coupling at least one mechanical pressing region to the capacitance measurement element comprises coupling a mechanical key to the capacitance measurement element, and measurement of change in capacitance of that mechanical pressing region comprises a detection that the mechanical key is pressed.

In an embodiment, alternatively or in addition to the above embodiments, the method also comprises: assigning at least one function to at least one mechanical pressing region, storing the assigned at least one function in a memory, and coupling the memory to the controller.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the technical effects described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term 'comprising' is used herein to mean including the method blocks or elements identified, but that such blocks or elements do not comprise an exclusive list and a method or device may contain additional blocks or elements.

It will be understood that the above description is given by way of example only and that various modifications may be made by those skilled in the art. The above specification, embodiments and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A portable device comprising:
   a controller;
   a touch sensing element comprising a display layer;
   at least one mechanical pressing region that is separate from the touch sensing element and the display layer, wherein the mechanical pressing region is located on an edge of the portable device perpendicular to the display layer and at least partially below the touch sensing element; and
   a capacitance measurement element integrated in the touch sensing element and coupled to the controller, and wherein the capacitance measurement element is configured to measure change in capacitance of the at least one mechanical pressing region.

2. A device as claimed in claim 1, wherein the touch sensing element and the display layer form a capacitive touch screen, the capacitance measurement element is integrated in the capacitive touch screen, and the at least one mechanical pressing region is coupled to the capacitive touch screen.

3. A device as claimed in claim 1, wherein the device has a prolonged shape in the horizontal plane, and at least one mechanical pressing region is positioned at an edge of the device.

4. A device as claimed in claim 3, wherein the touch sensing element extends over edges of the device.

5. A device as claimed in claim 1 comprising a casing, wherein the casing encloses a bottom and edges of the device, and the at least one mechanical pressing region is embedded in the casing.

6. A device as claimed in claim 5, wherein
   the casing comprises a frame,
   the frame supports the touch sensing element at least at two edges, and
   the at least one mechanical pressing region is embedded in the frame.

7. A device as claimed in claim 5, wherein the casing comprises non-conducting material.

8. A device as claimed in claim 1, wherein the at least one mechanical pressing region comprises a mechanical key coupled to the capacitance measurement element, and the capacitance measurement element is configured to measure change in capacitance of the at least one mechanical pressing region when the mechanical key is pressed.

9. A device as claimed in claim 8, wherein the controller is configured to trigger a function upon measurement of the change in capacitance of the at least one mechanical pressing region when the mechanical key is pressed.

10. A device as claimed in claim 9, further comprising a press detection element coupled to the controller, wherein the press detection element is configured to detect that the mechanical key is fully pressed, and wherein the controller is configured to trigger an additional function upon detection that the mechanical key is fully pressed.

11. A device as claimed in claim 1, wherein the capacitance measurement element comprises a capacitive field measurement element, and the capacitive field measurement element is configured to measure change in a capacitive field surrounding the at least one mechanical pressing region caused by proximity or physical interaction between the at least one mechanical pressing region and an external object.

12. A device as claimed in claim 1, further comprising a tactile feedback element configured to provide tactile feedback to a user of the device when the at least one mechanical pressing region is pressed.

13. A device as claimed in claim 1, implemented as a handheld electronic device.

14. A system comprising:
    a touch sensing unit comprising a capacitance measurement element and a display layer;
    at least one mechanical pressing region separate from the touch sensing unit and the display layer, wherein the mechanical pressing region is located on an edge of a portable device perpendicular to the display layer and at least partially below the touch sensing unit;
    a controller coupled to the capacitance measurement element; and
    a memory unit coupled to the controller, the memory unit comprising at least one function assigned to the at least one mechanical pressing region;
    wherein the capacitance measurement element is configured to measure change in capacitance of at least one mechanical pressing region, and
    wherein the controller is configured to trigger at least one function assigned to the at least one mechanical pressing region.

15. A system as claimed in claim 14, wherein the capacitance measurement element is configured to measure change in capacitance of the at least one mechanical pressing region caused by proximity or physical interaction between the at least one mechanical pressing region and a conductive stylus or a finger.

16. A system as claimed in claim 14, further comprising a movement detection unit coupled to the controller, wherein the movement detection unit is configured to detect movement of an external object in proximity of the at least one mechanical pressing region.

17. A system as claimed in claim 14, further comprising a cover configured to cover at least part of the touch sensing unit.

18. A method comprising:
    providing a portable device comprising a controller;
    attaching a touch sensing element comprising a display layer and an integrated capacitance measurement element to the portable device;
    coupling the integrated capacitance measurement element to the controller;

coupling at least one mechanical pressing region to the capacitance measurement element, the at least one mechanical pressing region being separate from the touch sensing element and the display layer, wherein the mechanical pressing region is located on an edge of the portable device perpendicular to the display layer and at least partially below the touch sensing element; and configuring the capacitance measurement element to measure change in capacitance of the at least one mechanical pressing region.

19. A method as claimed in claim 18, wherein coupling the at least one mechanical pressing region to the capacitance measurement element comprises coupling a mechanical key to the capacitance measurement element, and wherein measurement of change in capacitance of the at least one mechanical pressing region comprises a detection that the mechanical key is pressed.

20. A method as claimed in claim 18, further comprising:
assigning at least one function to the at least one mechanical pressing region;
storing the assigned at least one function in a memory; and
coupling the memory to the controller.

* * * * *